(12) United States Patent
Yu et al.

(10) Patent No.: US 10,008,824 B2
(45) Date of Patent: Jun. 26, 2018

(54) OPTICAL MODULE FOR PREVENTING LASER BEAM LEAKAGE AND CONTROL METHOD THEREOF

(71) Applicant: Huawei Technologies Co., Ltd., Shenzhen (CN)

(72) Inventors: Meiyong Yu, Shenzhen (CN); Wei Xu, Wuhan (CN); Song Yang, Wuhan (CN)

(73) Assignee: Huawei Technologies Co., Ltd., Shenzhen (CN)

(*) Notice: Subject to any disclaimer, the term of this patent is extended or adjusted under 35 U.S.C. 154(b) by 0 days. days.

(21) Appl. No.: 15/625,396

(22) Filed: Jun. 16, 2017

(65) Prior Publication Data

US 2017/0310082 A1    Oct. 26, 2017

Related U.S. Application Data

(63) Continuation of application No. PCT/CN2015/096291, filed on Dec. 3, 2015.

(30) Foreign Application Priority Data

Dec. 19, 2014 (CN) .......................... 2014 1 0804386

(51) Int. Cl.
| | |
|---|---|
| *H01S 3/13* | (2006.01) |
| *H01S 5/06* | (2006.01) |
| *H01S 5/022* | (2006.01) |
| *H01S 5/068* | (2006.01) |

(52) U.S. Cl.
CPC .......... *H01S 5/0608* (2013.01); *H01S 5/0228* (2013.01); *H01S 5/02248* (2013.01); *H01S 5/02252* (2013.01); *H01S 5/02284* (2013.01); *H01S 5/06825* (2013.01)

(58) Field of Classification Search
CPC .. H01S 5/02284; H01S 5/0608; H01S 5/0228; H01S 5/02252; H01S 5/02248; H01S 5/06825

See application file for complete search history.

(56) References Cited

U.S. PATENT DOCUMENTS

| | | | |
|---|---|---|---|
| 4,598,199 A | 7/1986 | Hentschel et al. | |
| 4,639,924 A * | 1/1987 | Tsunekawa | H01S 5/068 372/33 |
| 5,752,100 A | 5/1998 | Schrock | |

(Continued)

FOREIGN PATENT DOCUMENTS

| | | |
|---|---|---|
| CN | 1340726 A | 3/2002 |
| CN | 2574306 Y | 9/2003 |

(Continued)

*Primary Examiner* — Kinam Park (57) ABSTRACT

An optical module for preventing laser beam leakage and a control method thereof are disclosed. The optical module including a current control circuit, a first transistor, a laser, and a laser control unit. The laser control unit is configured to: if it is detected that an optical fiber is inserted in the optical fiber interface, perform control to turn on the laser, or if it is detected that no optical fiber is inserted in the optical fiber interface, control the laser to remain in an off state. A laser beam is effectively prevented from causing human bodily injury when an optical fiber is not inserted in an optical fiber interface.

9 Claims, 6 Drawing Sheets

(56) References Cited

U.S. PATENT DOCUMENTS

| | | | |
|---|---|---|---|
| 6,384,664 B1* | 5/2002 | Hellums | G11C 7/062 |
| | | | 327/525 |
| 6,554,490 B1* | 4/2003 | Sumi | G02B 6/4292 |
| | | | 385/139 |
| 2002/0024703 A1* | 2/2002 | Lee | H04B 10/0771 |
| | | | 398/141 |
| 2009/0168822 A1* | 7/2009 | Hung | G11B 7/126 |
| | | | 372/38.03 |

FOREIGN PATENT DOCUMENTS

| | | |
|---|---|---|
| CN | 1641391 A | 7/2005 |
| CN | 1869751 A | 11/2006 |
| CN | 101470409 A | 7/2009 |
| CN | 202494788 U | 10/2012 |
| CN | 203590234 U | 5/2014 |
| CN | 203759314 U | 8/2014 |
| EP | 1195771 A2 | 4/2002 |
| JP | S59186384 A | 10/1984 |
| JP | 2012065152 A | 3/2012 |
| WO | 2012036054 A1 | 3/2012 |

\* cited by examiner

OPTICAL MODULE FOR PREVENTING LASER BEAM LEAKAGE AND CONTROL METHOD THEREOF

CROSS-REFERENCE TO RELATED APPLICATIONS

This application is a continuation of International Application No. PCT/CN2015/096291, filed on Dec. 3, 2015, which claims priority to Chinese Patent Application No. 201410804386.1, filed on Dec. 19, 2014. The disclosures of the aforementioned applications are hereby incorporated by reference in their entireties.

TECHNICAL FIELD

Embodiments of the present application relate to optoelectronic technologies, and in particular, to an optical module for preventing laser beam leakage and a control method thereof.

BACKGROUND

To enable two neighboring communication devices to communicate with each other, the two devices are connected by using a pair of optical modules and an optical fiber. As a transmission distance of the optical module increases, laser power of a laser in the optical module becomes increasingly high. In a scenario such as that in which no optical fiber is inserted in an optical fiber interface of the optical module or a fiber cut occurs in an optical fiber, a leaked high-power laser beam may cause human bodily injury or eye injury.

Figure 1:
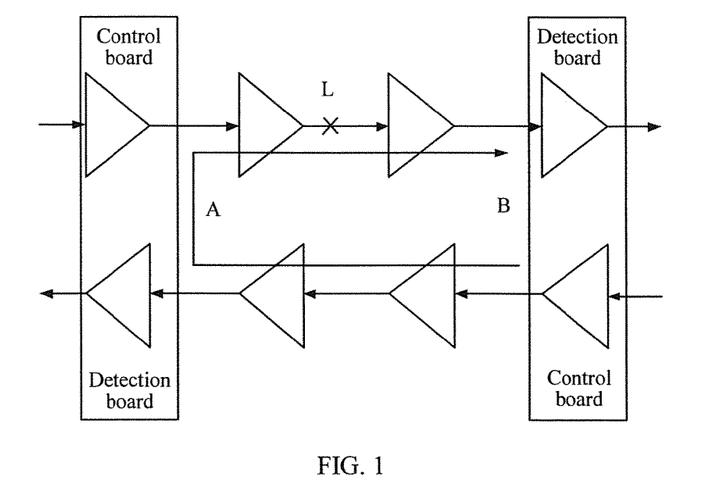
FIG. 1 is a schematic diagram of an IPA process when a fiber cut occurs in an optical fiber line in the prior art.

In the prior art, the problem of human bodily injury caused by a laser beam leakage of an optical module is resolved by means of intelligent power adjustment (IPA). FIG. 1 is a schematic diagram of an IPA process when a fiber cut occurs in an optical fiber line in the prior art. As shown in FIG. 1, when a fiber cut occurs at a point L in a line, a detection board at an end B detects a receiving loss of signal (RLOS) alarm and turns off a laser of a control board at the end B. In this way, a detection board at an end A is further triggered to detect the RLOS alarm, and then a system at the end A turns off a laser of a control board. In this case, there is no optical power in an optical fiber of a line between the end A and the end B. After IPA is started, the laser of the control board sends a probe laser beam to detect whether the line returns to normal. That is, a probe laser beam is sent after the control board at the end B is turned off for a period of time, and after the probe laser beam is received at the end A, the RLOS alarm is ended, so that the laser of the control board at the end A is turned on. In this case, if the optical fiber returns to normal, the RLOS alarm at the end B is ended, and further, the entire system resumes normal transmission.

However, the solution in the prior art can only perform, with an optical fiber being inserted, control to turn on or turn off a laser by means of a complete loop, and cannot resolve the problem of human bodily injury caused by a laser beam leakage of an optical module in a scenario in which no optical fiber is inserted in an optical fiber interface.

SUMMARY

Embodiments of the present application provide an optical module for preventing laser beam leakage and a control method thereof, so as to resolve a problem, which cannot be resolved by using solutions in the prior art, that a laser beam leakage of a laser of an optical module causes human bodily injury in a scenario in which no optical fiber is inserted in an optical fiber interface.

A first aspect of the present application provides an optical module for preventing laser beam leakage, where the optical module includes: a current control circuit, a first transistor, a laser, and a laser control unit, where the current control circuit is connected to a base of the first transistor, and is configured to provide a stable current; the laser is connected to an emitter of the first transistor; and the laser control unit is separately connected to the base of the first transistor and an optical fiber interface; and the laser control unit is configured to: if it is detected that an optical fiber is inserted in the optical fiber interface, perform control to turn on the laser; or if it is detected that no optical fiber is inserted in the optical fiber interface, control the laser to remain in an off state.

With reference to the first aspect, in a first possible implementation manner of the first aspect, the optical module further includes a bleeder circuit, where a first end of the bleeder circuit is connected to a power supply, a second end of the bleeder circuit is connected to the base of the first transistor, and a third end of the bleeder circuit is connected to a collector of the first transistor.

With reference to the first aspect or the first possible implementation manner of the first aspect, in a second possible implementation manner of the first aspect, the laser control unit includes a laser egress control switch, a logical operation module, and a second transistor; and the laser egress control switch is disposed at the optical fiber interface, and is configured to detect whether an optical fiber is inserted in the optical fiber interface;

a first input port of the logical operation module is connected to a first end of the laser egress control switch; a second input port of the logical operation module is grounded or is connected to a power supply; an output port of the logical operation module is connected to a base of the second transistor; and a collector of the second transistor is connected to the base of the first transistor; and when the laser egress control switch detects that an optical fiber is inserted in the optical fiber interface, the first end of the laser egress control switch outputs a low electrical level, and the output port of the logical operation module outputs a low electrical level, so as to perform control to turn on the laser; or when the laser egress control switch detects that no optical fiber is inserted in the optical fiber interface, the first end of the laser egress control switch outputs a high electrical level, and the output port of the logical operation module outputs a high electrical level, so as to control the laser to remain in an off state.

With reference the second possible implementation manner of the first aspect, in a third possible implementation manner of the first aspect, a second end of the laser egress control switch is grounded; a third end of the laser egress control switch is connected to a power supply; and when an optical fiber is inserted in the optical fiber interface, the first end of the laser egress control switch is connected to the second end of the laser egress control switch; or when no optical fiber is inserted in the optical fiber interface, the first end of the laser egress control switch is connected to the third end of the laser egress control switch.

With reference to the second or the third possible implementation manner of the first aspect, in a fourth possible implementation manner of the first aspect, the logical operation module is an OR gate circuit, a first input port of the OR gate circuit is connected to the first end of the laser egress control switch, and a second input port of the OR gate circuit is grounded.

With reference to the second or the third possible implementation manner of the first aspect, in a fifth possible implementation manner of the first aspect, the logical operation module is an AND gate circuit, a first input port of the AND gate circuit is connected to the first end of the laser egress control switch, and a second input port of the AND gate circuit is connected to a power supply.

With reference to any one of the first aspect or the first to the fifth possible implementation manners, in a sixth possible implementation manner of the first aspect, the optical module further includes a collection circuit, where a first end of the collection circuit is connected to the emitter of the first transistor, a second end of the collection circuit is connected to the laser, and the collection circuit is configured to collect a current in the laser.

A second aspect of the present application provides a control method of an optical module for preventing laser beam leakage, where the optical module includes a current control circuit, a first transistor, a laser, and a laser control unit; the current control circuit is connected to a base of the first transistor; the laser is connected to an emitter of the first transistor; the laser control unit is separately connected to the base of the first transistor and an optical fiber interface; and the method includes:

detecting, by the laser control unit, whether an optical fiber is inserted in the optical fiber interface; and if the laser control unit detects that an optical fiber is inserted in the optical fiber interface, performing, by the laser control unit, control to turn on the laser in the optical module; or if the laser control unit detects that no optical fiber is inserted in the optical fiber interface, controlling, by the laser control unit, the laser in the optical module to remain in an off state.

With reference to the second aspect, in a first possible implementation manner of the second aspect, the laser control unit includes a laser egress control switch, a logical operation module, and a second transistor; the laser egress control switch is disposed at the optical fiber interface; a first input port of the logical operation module is connected to a first end of the laser egress control switch; a second input port of the logical operation module is grounded or is connected to a power supply; an output port of the logical operation module is connected to a base of the second transistor; and a collector of the second transistor is connected to the base of the first transistor; and the if the laser control unit detects that an optical fiber is inserted in the optical fiber interface, performing control to turn on the laser in the optical module includes: if the laser egress control switch detects that an optical fiber is inserted in the optical fiber interface, providing, by the logical operation module according to an electrical level input in the first input port, a low electrical level for the base of the second transistor by using the output port after calculation, so as to turn on the laser; and the if the laser control unit detects that no optical fiber is inserted in the optical fiber interface, controlling, by the laser control unit, the laser in the optical module to remain in an off state includes: if the laser egress control switch detects that no optical fiber is inserted in the optical fiber interface, providing, by the logical operation module according to an electrical level input in the first input port, a high electrical level for the base of the second transistor by using the output port after calculation, so as to make the laser remain in the off state.

According to the optical module for preventing laser beam leakage and the control method thereof provided by the present application, the laser control unit is disposed on the basis of the existing optical module; the current control circuit is connected to the base of the first transistor, and is configured to provide a stable current; the laser is connected to the emitter of the first transistor; the laser control unit is separately connected to the base of the first transistor and the optical fiber interface; and the laser control unit performs control to turn on the laser when detecting that an optical fiber is inserted in the optical fiber interface, and controls the laser to remain in an off state when detecting that no optical fiber is inserted in the optical fiber interface. When it is detected that no optical fiber is inserted in an optical fiber interface, the laser is controlled to remain in an off state, so that a laser beam is effectively prevented from causing human bodily injury when the optical fiber interface is exposed.

BRIEF DESCRIPTION OF DRAWINGS

To describe the technical solutions in the embodiments of the present application or in the prior art more clearly, the following briefly describes the accompanying drawings required for describing the embodiments or the prior art. Apparently, the accompanying drawings in the following description show some embodiments of the present application, and a person of ordinary skill in the art may still derive other drawings from these accompanying drawings without creative efforts.

DETAILED DESCRIPTION

To make the objectives, technical solutions, and advantages of the embodiments of the present application clearer, the following clearly describes the technical solutions in the embodiments of the present application with reference to the accompanying drawings in the embodiments of the present application. Apparently, the described embodiments are some but not all of the embodiments of the present application. All other embodiments obtained by persons of ordinary skill in the art based on the embodiments of the present application without creative efforts shall fall within the protection scope of the present application.

The technical solutions provided by the present application may be used to improve optical modules of various communications devices, so as to resolve a problem, which cannot be resolved by the prior art, that a laser beam causes human bodily injury when an optical fiber interface is exposed.

Figure 2:
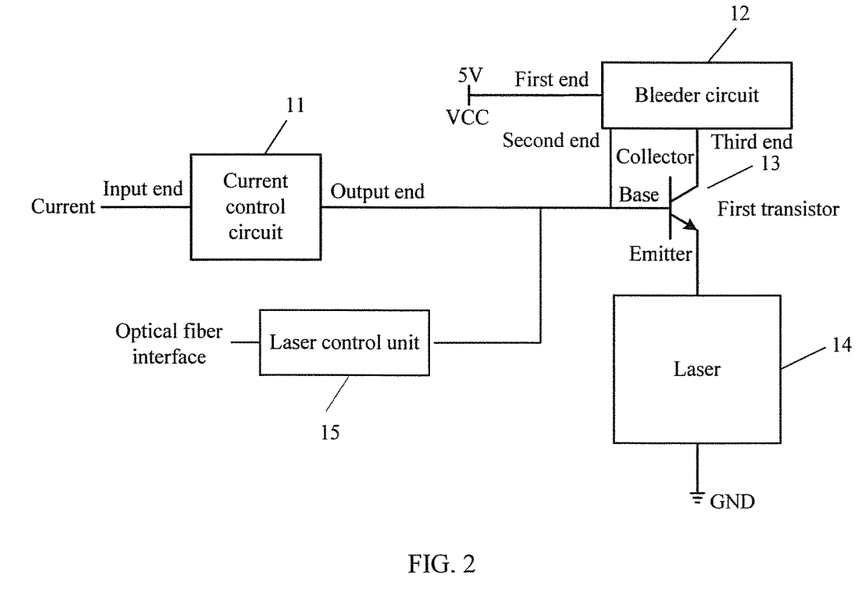
FIG. 2 is a schematic principle diagram of Embodiment 1 of an optical module for preventing laser beam leakage according to the present application.

FIG. 2 is a schematic principle diagram of Embodiment 1 of an optical module for preventing laser beam leakage according to the present application. As shown in FIG. 2, the optical module for preventing laser beam leakage includes: a current control circuit 11, a first transistor 13, a laser 14, and a laser control unit 15.

The current control circuit 11 is connected to a base of the first transistor 13, and is configured to provide a stable current. The laser 14 is connected to an emitter of the first transistor 14. The laser control unit 15 is separately connected to the base of the first transistor 13 and an optical fiber interface.

The laser control unit 15 is configured to: if it is detected that an optical fiber is inserted in the optical fiber interface, perform control to turn on the laser 14; or if it is detected that no optical fiber is inserted in the optical fiber interface, control the laser 14 to remain in an off state.

In this embodiment, main functions of the current control circuit 11 are to amplify an input current to a required value, and output the current. The laser control unit 15 is connected to the optical fiber interface, so that the laser control unit 15 directly collects a status of whether an optical fiber is inserted in the optical fiber interface, and then performs control to turn on the laser 14 or controls the laser 14 to remain in an off state. Specifically, when the laser control unit 15 detects that an optical fiber is removed from the optical fiber interface, and the laser control unit 15 controls the laser 14 to remain in an off state. In a process in which no optical fiber is inserted in the optical fiber interface, the laser control unit 15 controls the laser 14 to remain in an off state, until the laser control unit 15 detects that an optical fiber is inserted in the optical fiber interface, that is, when the optical fiber interface is not exposed, the laser control unit 15 performs control to turn on the laser 14. In a process in which an optical fiber is not removed from the optical fiber interface, the laser control unit 15 may control the laser 14 to remain in an on state.

In addition, different voltages need to be provided for a collector of the first transistor 13 and the base of the first transistor 13. Power supplies with different voltages may be used to respectively connect to the collector the first transistor 13 and the base of the first transistor 13; or a same power supply may be used to separately connect to the collector and the base of the first transistor 13 by means of voltage division, so as to provide voltages for working of the first transistor 13. Generally, a voltage needed by the collector is slightly higher.

In a solution of this embodiment, the optical module further includes a bleeder circuit 12. A first end of the bleeder circuit 12 is connected to a power supply, a second end of the bleeder circuit 12 is connected to the base of the first transistor 13, a third end of the bleeder circuit 12 is connected to the collector of the first transistor 13, and a voltage provided by the power supply for the collector of the first transistor 13 through the third end of the bleeder circuit 12 is a little greater than a voltage provided by the power supply for the base of the first transistor 13 through the second end of the bleeder circuit 12. Generally, a voltage difference is within 0.3 V.

The bleeder circuit 12 includes at least two different resistors, and a supply voltage may be divided by selecting proper resistors. The second end and the third end are two different outputs of the bleeder circuit 12, and the second end and the third end of the bleeder circuit 12 are respectively connected to the base and the collector of the first transistor 13. To enable the first transistor 13 to work normally, a voltage output by the third end of the bleeder circuit is a little greater than a voltage output by the second end.

According to the optical module for preventing laser beam leakage provided by this embodiment, the laser control unit is disposed on the basis of the existing optical module; the current control circuit is connected to the base of the first transistor, and is configured to provide a stable current; the laser is connected to the emitter of the first transistor; the laser control unit is separately connected to the base of the first transistor and the optical fiber interface; and the laser control unit performs control to turn on the laser when detecting that an optical fiber is inserted in the optical fiber interface, and controls the laser to remain in an off state when detecting that no optical fiber is inserted in the optical fiber interface. When it is detected that no optical fiber is inserted in an optical fiber interface, a laser is controlled to remain in an off state, so that a laser beam is effectively prevented from causing human bodily injury when the optical fiber interface is exposed.

Figure 3:
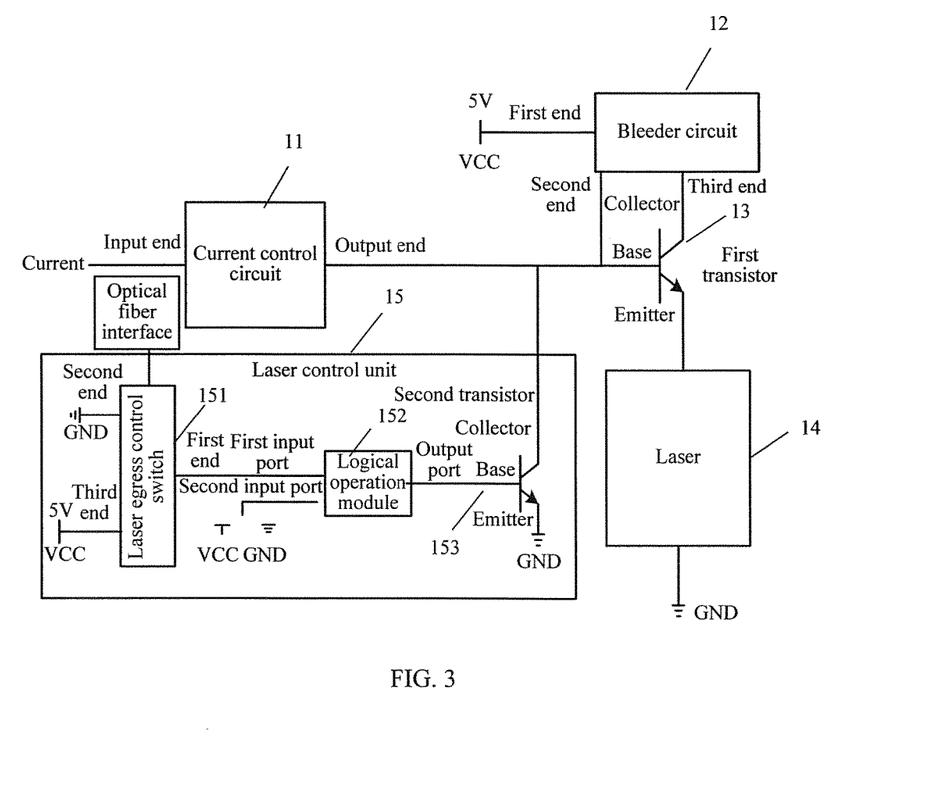
FIG. 3 is a schematic principle diagram of Embodiment 2 of an optical module for preventing laser beam leakage according to the present application.

FIG. 3 is a schematic principle diagram of Embodiment 2 of an optical module for preventing laser beam leakage according to the present application. As shown in FIG. 2, on the basis of the foregoing Embodiment 1, the laser control unit 15 specifically includes: a laser egress control switch 151, a logical operation module 152, and a second transistor 153. The laser egress control switch 151 is disposed at the optical fiber interface, is connected to the optical fiber interface, and is configured to detect whether an optical fiber is inserted in the optical fiber interface.

In this embodiment, the laser egress control switch 151 is directly connected to the optical fiber interface, and may be directly disposed at the optical fiber interface. Insertion or removal of an optical fiber may control a closed state of the laser egress control switch 151. The optical fiber interface may be a square interface or a circular interface. This is not limited.

Specifically, a first input port of the logical operation module 152 is connected to a first end of the laser egress control switch 151; a second input port of the logical operation module 152 is grounded or is connected to a power supply; an output port of the logical operation module 152 is connected to a base of the second transistor 153; and a collector of the second transistor 153 is connected to the base of the first transistor 13.

In this embodiment, when the laser egress control switch 151 detects that an optical fiber is inserted in the optical fiber interface, the first end of the laser egress control switch 151 outputs a low electrical level, and the output port of the logical operation module 152 outputs a low electrical level, so as to perform control to turn on the laser 14. Alternatively, when the laser egress control switch 153 detects that no optical fiber is inserted in the optical fiber interface, the first end of the laser egress control switch 151 outputs a high electrical level, and the output port of the logical operation module 152 outputs a high electrical level, so as to control the laser 14 to remain in an off state.

Ina specific implementation manner of the foregoing features, a second end of the laser egress control switch 151 is grounded; a third end of the laser egress control switch 151 is connected to a power supply; and when an optical fiber is inserted in the optical fiber interface, the first end of the laser egress control switch 151 is connected to the second end of the laser egress control switch 151; or when no optical fiber is inserted in the optical fiber interface, the first end of the laser egress control switch 151 is connected to the third end of the laser egress control switch.

According to the foregoing principle of controlling the laser 14 and connection relationship of the laser egress control switch 151, for the logical operation module 152, there are at least the following two implementation manners.

In a first implementation manner, when the logical operation module 152 is an OR gate circuit, a first input port of the OR gate circuit is connected to the first end of the laser egress control switch 151. A second input port of the OR gate circuit is grounded, so that after an optical fiber is inserted in the optical fiber interface, an output port of the OR gate circuit can provide a low electrical level for the subsequent second transistor 153.

Specifically, an optical fiber is inserted in the optical fiber interface, and the first end of the laser egress control switch 151 is connected to the second end of the laser egress control switch 151. That is, a low electrical level is input in the first input port of the OR gate circuit, and an OR operation is performed by using the input low electrical level and a low electrical level of the second input port, that is, a low electrical level is generated at the base of the second transistor. An electrical level of the collector of the second transistor is triggered to become higher, and then an electrical level of the collector of the first transistor also becomes higher, so that a current is generated at the emitter of the first transistor, and the laser is turned on. The optical fiber is removed from the optical fiber interface, and the first end of the laser egress control switch 151 is connected to the third end of the laser egress control switch 151. That is, a high electrical level is input in the first input port of the OR gate circuit, and an OR operation is performed by using the input high electrical level and a low electrical level of the second input port, that is, a high electrical level is generated at the base of the second transistor 153. An electrical level of the collector of the second transistor 153 is triggered to become lower, and then an electrical level of the collector of the first transistor 13 also becomes lower, so that a current is not generated at the emitter of the first transistor 13, and the laser 14 is turned off.

In a second implementation manner, when the logical operation module 152 is an AND gate circuit, a first input port of the AND gate circuit is connected to the first end of the laser egress control switch 151. A second input port of the AND gate circuit is connected to a power supply, so that when no optical fiber is inserted in the optical fiber interface, an output port of the AND gate circuit can provide a high electrical level for the base of the subsequent second transistor 153.

Specifically, an optical fiber is inserted in the optical fiber interface, and the first end of the laser egress control switch 151 is connected to the second end of the laser egress control switch 151. That is, a low electrical level is input in the first input port of the AND gate circuit, and an AND operation is performed by using the input low electrical level and a high electrical level of the second input port, that is, a low electrical level is generated at the base of the second transistor 153. An electrical level of the collector of the second transistor 153 is triggered to become higher, and then an electrical level of the collector of the first transistor 13 also becomes higher, so that a current is generated at the emitter of the first transistor 13, and the laser is turned on. The optical fiber is removed from the optical fiber interface, and the first end of the laser egress control switch 151 is connected to the third end of the laser egress control switch 151. That is, a high electrical level is input in the first input port of the AND gate circuit, and an AND operation is performed by using the input high electrical level and a high electrical level of the second input port, that is, a high electrical level is generated at the base of the second transistor 153. An electrical level of the collector of the second transistor 153 is triggered to become lower, and then an electrical level of the collector of the first transistor 13 also becomes lower, so that a current is not generated at the emitter of the first transistor 13, and the laser is turned off.

For the OR gate circuit or the AND gate circuit in this embodiment, a chip model is not specifically limited, and may be selected according to an actual application and a cabling requirement as long as an OR operation or an AND operation can be implemented.

In addition, a function implemented by the logical operation module 152 in this application may also be implemented by using another existing hardware or software manner, which is not limited to an AND gate or an OR gate, as long as a laser can be turned on when an optical fiber is inserted in an optical fiber interface, and the laser can be turned off when the optical fiber is removed from the optical fiber interface.

According to the optical module for preventing laser beam leakage provided by this embodiment, the laser control unit that includes the laser egress control switch 151, the logical operation module 152, and the second transistor 153 is disposed on the basis of the existing optical module; the current control circuit is connected to the base of the first transistor, and is configured to provide a stable current; the laser is connected to the emitter of the first transistor; the laser egress control switch is disposed at the optical fiber interface to collect a status of insertion of an optical fiber; the laser egress control switch is connected to the logical operation module; the output of the logical operation module is connected to the base of the second transistor; the collector of the second transistor is connected to the base of the first transistor; and when detecting that an optical fiber is inserted in the optical fiber interface, the laser egress control switch outputs a low electrical level backwards by using the logical operation module, so as to perform control to turn on the laser, or when detecting that no optical fiber is inserted in the optical fiber interface, the laser egress control switch outputs a high electrical level backwards by using the logical operation module, so as to control the laser to remain in an off state. When it is detected that no optical fiber is inserted in an optical fiber interface, a laser is controlled to remain in an off state, so that a laser beam is effectively prevented from causing human bodily injury when the optical fiber interface is exposed.

Figure 4:
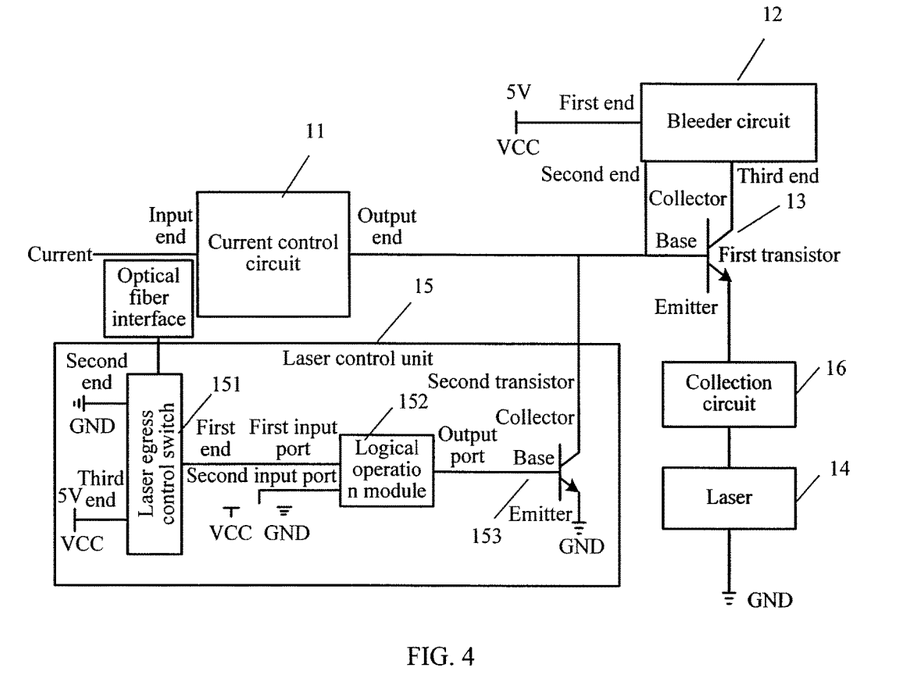
FIG. 4 is a schematic principle diagram of Embodiment 3 of an optical module for preventing laser beam leakage according to the present application.

FIG. 4 is a schematic principle diagram of Embodiment 3 of an optical module for preventing laser beam leakage according to the present application. As shown in FIG. 4, on the basis of the foregoing two embodiments, the optical module further includes a collection circuit 16. A first end of the collection circuit 16 is connected to the emitter of the first transistor 13, a second end of the collection circuit 16 is connected to the laser 14, and the collection circuit is configured to collect a current in the laser.

In this embodiment, the collection circuit generally includes one or more resistors, and in the collection circuit, multiple resistors may be connected in serial, or in parallel, or both in serial and in parallel, making it convenient to directly obtain through calculation a current of the laser by measuring voltages of the resistors. Further, a voltage applied to the laser 14 may be divided, so as to protect the laser.

According to the optical module for preventing laser beam leakage provided by this embodiment, the laser egress control switch is disposed at the optical fiber interface, and on the basis of the existing circuit, according to whether an optical fiber is inserted, control is directly performed to turn on the laser or the laser is directly controlled to remain in an off state. When no optical fiber is inserted, the laser is not turned on, so that a laser beam is effectively prevented from causing human bodily injury in a process of replacing an optical fiber.

Figure 5A:
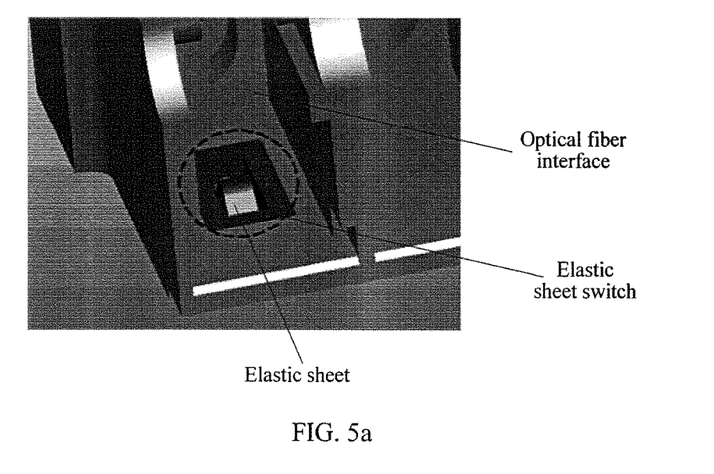
FIG. 5a is a schematic front view of a laser egress control switch of an instance of an optical module for preventing laser beam leakage according to the present application.
Figure 5B:
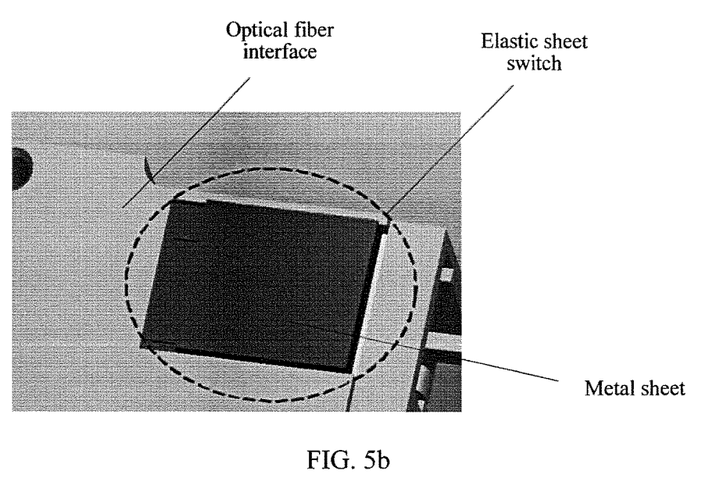
FIG. 5b is a schematic rear view of a laser egress control switch of an instance of an optical module for preventing laser beam leakage according to the present application.

FIG. 5a is a schematic front view of a laser egress control switch of an instance of an optical module for preventing laser beam leakage according to the present application. FIG. 5b is a schematic rear view of a laser egress control switch of an instance of an optical module for preventing laser beam leakage according to the present application. As shown in FIG. 5a and FIG. 5b, on the basis of the foregoing embodiment, it is assumed that the laser egress control switch is an elastic sheet switch. The elastic sheet switch includes an elastic sheet and a metal sheet that protrude from a front of an optical fiber interface. When an optical fiber is inserted, the elastic sheet switch is closed under pressure of the optical fiber, and a first end of the laser egress control switch is connected to a second end of the laser egress control switch. When the optical fiber is removed from the optical fiber interface, the elastic sheet switch is open, and the first end of the laser egress control switch is connected to a third end of the laser egress control switch.

In this embodiment, as shown in FIG. 5a and FIG. 5b, the elastic sheet switch is directly disposed at the optical fiber interface. When the optical fiber is inserted, the elastic sheet of the elastic sheet switch is closed under pressure, and the first end of the laser egress control switch is connected to the second end of the laser egress control switch (that is, the elastic sheet at the upper part of the elastic sheet switch in FIG. 5a and the metal at the rear of the elastic sheet switch in FIG. 5b are respectively the first end and the second end), so as to provide a low electrical level for the base of the second transistor by using an OR gate circuit. Similarly, after the optical fiber is removed from the optical fiber interface, the elastic sheet switch springs open, and the first end of the laser egress control switch is connected to the third end of the laser egress control switch, so as to provide a high electrical level for the base of the second transistor by using an OR gate circuit.

Optionally, for the laser egress control switch in the present application, the foregoing function may be implemented by selecting another control switch such as an optical resistor or a sensor. For example:

when the laser egress control switch includes a sensor, when an optical fiber is inserted in the optical fiber interface, the sensor performs control to connect the first end of the laser egress control switch to the second end of the laser egress control switch; or when the optical fiber is removed from the optical fiber interface, the sensor performs control to connect the first end of the laser egress control switch to the third end of the laser egress control switch; or when the laser egress control switch includes an optical resistor, when the optical fiber is inserted in the optical fiber interface, light on the optical resistor becomes weaker, a resistance value of the optical resistor decreases, and the first end of the laser egress control switch is connected to the second end of the laser egress control switch; or when the optical fiber is removed from the optical fiber interface, light on the optical resistor becomes stronger, the resistance value of the optical resistor increases, and the first end of the laser egress control switch is connected to the third end of the laser egress control switch.

An optical resistor that meets the following condition may be selected: a resistance value of the optical resistor increases when light is dark. That is, when an optical fiber is inserted, the resistance value of the optical resistor increases, which is equivalent to that the first end is connected to the second end; and when the optical fiber is removed, the resistance value of the optical resistor decreases, which is equivalent to that the first end is connected to the third end.

In addition, an optical resistor may be selected according to an actual situation, and this application is not merely limited to the foregoing situation.

According to the optical module for preventing laser beam leakage provided by this embodiment, the laser egress control switch is disposed at the optical fiber interface; the control switch may include a type of switch such as an elastic sheet switch, an optical resistor, or a sensor; the first end of the laser egress control switch is connected to the logical operation module, and the other two ends are respectively connected to a power supply and the ground; the output port of the logical operation module provides a high/low electrical level for the base, which is connected to the output port of the logical operation module, of the second transistor, so as to perform control to turn on the laser or control the laser to remain in an off state. That is, on the basis of the existing circuit, directly according to whether an optical fiber is inserted, control is performed not to turn on the laser when no optical fiber is inserted, so that a laser beam is effectively prevented from causing human bodily injury in a process of replacing an optical fiber.

Figure 6:
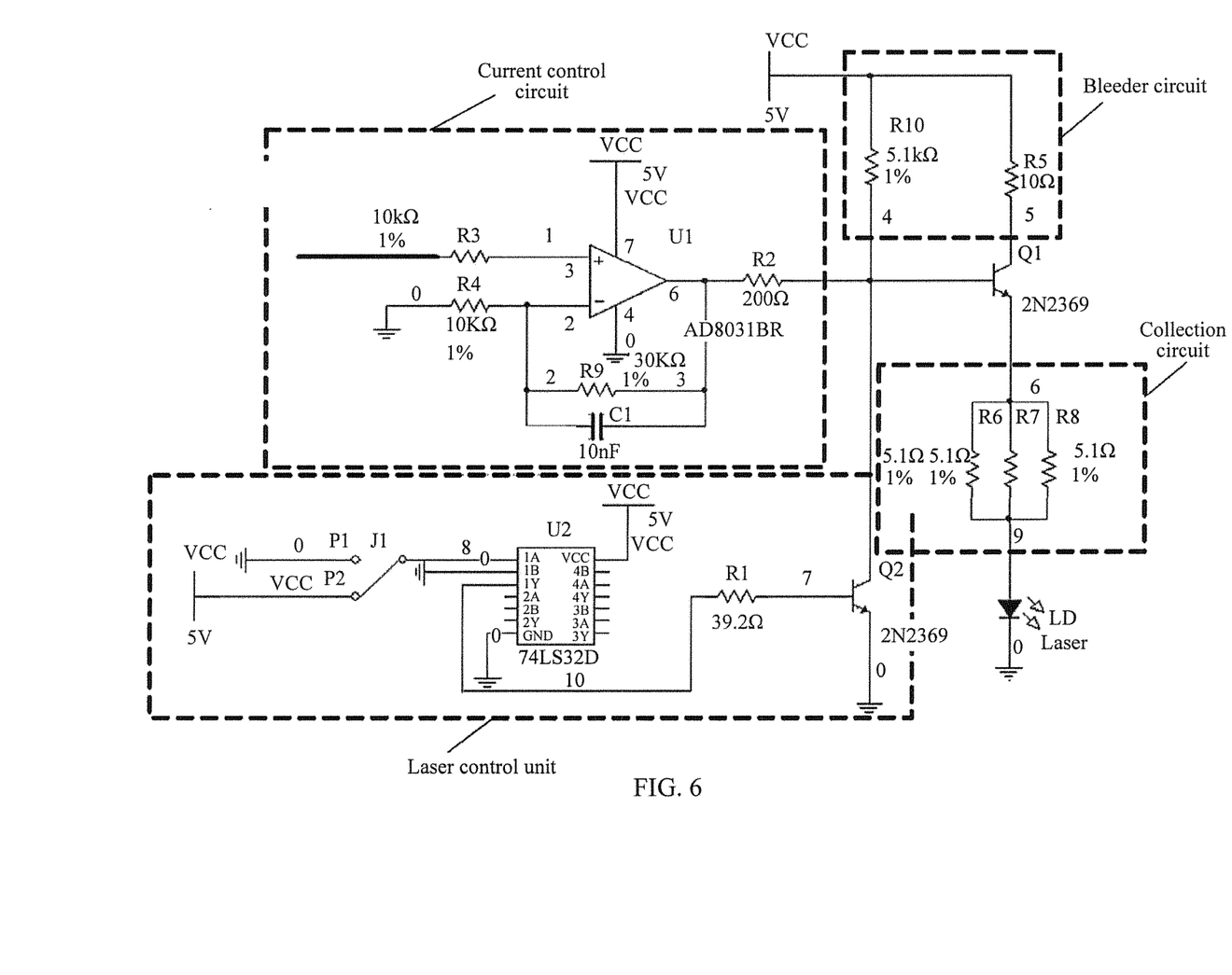
FIG. 6 is a principle diagram of an instance of an optical module for preventing laser beam leakage according to the present application.

FIG. 6 is a principle diagram of an implementation of an optical module for preventing laser beam leakage according to the present application. As shown in FIG. 6, on the basis of the foregoing Embodiment 1 and Embodiment 2, this embodiment provides a specific implementation manner of the optical module for preventing laser beam leakage. Specifically, the current control circuit includes a power amplification circuit, and is configured to provide a stable current for the base of the first transistor. In an application process, a voltage output by the power amplification circuit is adjusted by changing a voltage of the collector of the second transistor, so as to control a voltage of the base of the first transistor. In this embodiment, a model of a selected amplifier is AD8301BR, and the logical operation module in the laser control unit is implemented by using an OR gate circuit U2. The OR gate circuit is used to control an electrical level of the base of the second transistor Q2 according to a status of the laser egress control switch, so as to perform control to turn on the laser or control the laser to remain in an off state. A model of the OR gate circuit used in this embodiment is 74LS32D.

Refer to FIG. 6 for connections of the other components in the circuit principle diagram 6 of this embodiment. In the circuit described above, when an optical fiber is inserted in the optical fiber interface, J1 is connected to P1; an OR operation is performed by using an input electrical level and a low electrical level, and a result of the operation is output; U2 generates a low electrical level at the base P6 of the second transistor Q2, and an electrical level of the collector P3 of the second transistor Q2 is triggered to become higher, and then an electrical level of the collector P4 of the first transistor Q1 also becomes higher, so that the emitter P5 of the first transistor Q1 generates a current, and the laser is turned on.

When the optical fiber is removed from the optical fiber interface, J1 is connected to P2; an OR operation is performed by using an input electrical level and a low electrical level, and a result of the operation is output; U2 generates a high electrical level at the base P6 of the second transistor Q2, and an electrical level of the collector P3 of the second transistor Q2 is triggered to become lower, and then an electrical level of the collector P4 of the first transistor Q1 also becomes higher, so that the current at the emitter P5 of the first transistor Q1 disappears, and the laser is turned off.

Optionally, the second transistor Q2 is mainly used for level conversion, and therefore, may be replaced by a MOS transistor. When the second transistor Q2 is replaced by a MOS transistor, one end of the MOS transistor is directly connected to the output of the logical operation module, and another end of the MOS transistor is connected to the base of the first transistor.

According to the optical module for preventing laser beam leakage provided by this embodiment, the laser egress control switch is disposed at the optical fiber interface, a status of whether an optical fiber is inserted is collected by using the laser egress control switch, and a high electrical level or a low electrical level is provided for the base of the first transistor according to whether the optical fiber is inserted. When no optical fiber is inserted, control is performed not to turn on a laser, so that a laser beam is effectively prevented from causing human bodily injury when an optical fiber interface is exposed, for example, in a process of replacing an optical fiber.

Figure 7:
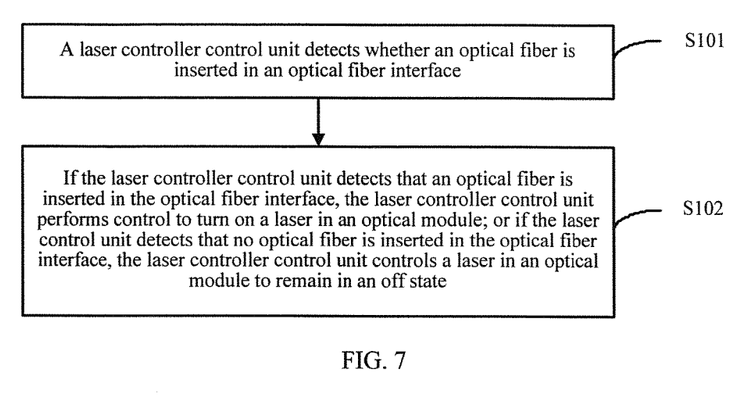
FIG. 7 is a flowchart of a control method of an optical module for preventing laser beam leakage according to the present application.

FIG. 7 is a flowchart of a control method of an optical module for preventing laser beam leakage according to the present application. As shown in FIG. 7, the control method of an optical module for preventing laser beam leakage is used to control the optical module in FIG. 1 to FIG. 6 in the present application. The optical module includes a current control circuit, a first transistor, a laser, and a laser control unit. The current control circuit is connected to a base of the first transistor. The laser is connected to an emitter of the first transistor. The laser control unit is separately connected to the base of the first transistor and an optical fiber interface. Specific steps of the method include:

S101: The laser control unit detects whether an optical fiber is inserted in the optical fiber interface.

In this embodiment, a status of the laser egress control switch is detected, for example, in a hardware manner of using the laser control unit connected to the optical fiber interface. When the laser control unit detects that two particular ends are connected, it indicates that an optical fiber is inserted in the optical fiber interface; when the laser control unit detects that two particular ends are connected, it indicates that no optical fiber is inserted in the optical fiber interface.

S102: If the laser control unit detects that an optical fiber is inserted in the optical fiber interface, the laser control unit performs control to turn on the laser in the optical module; or if the laser control unit detects that no optical fiber is inserted in the optical fiber interface, the laser control unit controls the laser in the optical module to remain in an off state.

In this embodiment, if it is detected that an optical fiber is inserted in the optical fiber interface, control is performed to turn on the laser by using software or hardware. If it is detected that the optical fiber is removed from the optical fiber interface, that is, a status that no optical fiber is inserted, the laser is controlled, by using software or hardware, to remain in an off state, so that no laser beam is generated when no optical fiber is inserted.

Specifically, the laser control unit in this embodiment includes a laser egress control switch, a logical operation module, and a second transistor; the laser egress control switch is disposed at the optical fiber interface; a first input port of the logical operation module is connected to a first end of the laser egress control switch; a second input port of the logical operation module is grounded or is connected to a power supply; an output port of the logical operation module is connected to a base of the second transistor; and a collector of the second transistor is collected to the base of the first transistor. Step S102 specifically includes:

if the laser egress control switch detects that an optical fiber is inserted in the optical fiber interface, providing, by the logical operation module according to an electrical level input in the first input port, a low electrical level for the base of the second transistor by using the output port after calculation, so as to turn on the laser; or if the laser egress control switch detects that no optical fiber is inserted in the optical fiber interface, providing, by the logical operation module according to an electrical level input in the first input port, a high electrical level for the base of the second transistor by using the output port after calculation, so as to make the laser remain in the off state.

According to the control method of the optical module for preventing laser beam leakage provided by this embodiment, a laser control unit is disposed on the basis of the existing optical module; and the laser control unit directly detects whether an optical fiber is inserted in the optical fiber interface; and performs control to turn on the laser if it is detected that an optical fiber is inserted in the optical fiber interface, or controls the laser to remain in an off state if it is detected that no optical fiber is inserted in the optical fiber interface. That is, when no optical fiber is inserted, the laser is not turned on, so that a laser beam is effectively prevented from causing human bodily injury in a process of replacing an optical fiber.

Finally, it should be noted that the foregoing embodiments are merely intended for describing the technical solutions of the present application, but not for limiting the present application. Although the present application is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present application.

What is claimed is:

1. An optical module for preventing laser beam leakage, the optical module comprising: a current control circuit, a first transistor, a laser, and a laser control unit, wherein
a current control circuit connected to a base of a first transistor and configured to provide a stable current;
a laser connected to an emitter of the first transistor; and
a laser control unit separately connected to the base of the first transistor and an optical fiber interface, wherein the laser control unit is configured to:
if it is detected that an optical fiber is inserted in the optical fiber interface, perform control to turn on the laser, or
if it is detected that no optical fiber is inserted in the optical fiber interface, control the laser to remain in an off state.

2. The optical module according to claim 1, further comprising:
a bleeder circuit having a first end connected to a power supply, a second end connected to the base of the first transistor, and a third end connected to a collector of the first transistor.

3. The optical module according to claim 1, wherein the laser control unit comprises:
a laser egress control switch disposed at the optical fiber interface and configured to detect whether an optical fiber is inserted in the optical fiber interface;
a logical operation module having a first input port connected to a first end of the laser egress control switch, a second input port grounded or connected to a power supply, an output port connected to a base of a second transistor, wherein a collector of the second transistor is connected to the base of the first transistor; and
wherein when the laser egress control switch detects that an optical fiber is inserted in the optical fiber interface, the first end of the laser egress control switch outputs a low electrical level, and the output port of the logical operation module outputs a low electrical level, so as to perform control to turn on the laser, or when the laser egress control switch detects that no optical fiber is inserted in the optical fiber interface, the first end of the laser egress control switch outputs a high electrical level, and the output port of the logical operation module outputs a high electrical level, so as to control the laser to remain in an off state.

4. The optical module according to claim 3, wherein:
a second end of the laser egress control switch is grounded;
a third end of the laser egress control switch is connected to a power supply; and
when an optical fiber is inserted in the optical fiber interface, the first end of the laser egress control switch is connected to the second end of the laser egress control switch, or when no optical fiber is inserted in the optical fiber interface, the first end of the laser egress control switch is connected to the third end of the laser egress control switch.

5. The optical module according to claim 3, wherein the logical operation module is an OR gate circuit, a first input port of the OR gate circuit is connected to the first end of the laser egress control switch, and a second input port of the OR gate circuit is grounded.

6. The optical module according to claim 3, wherein the logical operation module is an AND gate circuit, a first input port of the AND gate circuit is connected to the first end of the laser egress control switch, and a second input port of the AND gate circuit is connected to a power supply.

7. The optical module according to claim 1, further comprising a collection circuit, wherein a first end of the collection circuit is connected to the emitter of the first transistor, a second end of the collection circuit is connected to the laser; and the collection circuit is configured to collect a current in the laser.

8. A control method of an optical module for preventing laser beam leakage, wherein the optical module comprises a current control circuit connected to a base of a first transistor, a laser connected to an emitter of the first transistor, and a laser control unit separately connected to the base of the first transistor and an optical fiber interface, and wherein the method comprises:
detecting, by the laser control unit, whether an optical fiber is inserted in the optical fiber interface; and
if the laser control unit detects that an optical fiber is inserted in the optical fiber interface, performing, by the laser control unit, control to turn on the laser in the optical module, or if the laser control unit detects that no optical fiber is inserted in the optical fiber interface, controlling, by the laser control unit, the laser in the optical module to remain in an off state.

9. The method according to claim 8, wherein the laser control unit comprises:
a laser egress control switch disposed at the optical fiber interface;
a logical operation module having a first input port connected to a first end of the laser egress control switch, a second input port grounded or connected to a power supply, an output port connected to a base of a second transistor, wherein a collector of the second transistor is connected to the base of the first transistor; and
wherein if the laser control unit detects that an optical fiber is inserted in the optical fiber interface, performing control to turn on the laser in the optical module comprises:
if the laser egress control switch detects that an optical fiber is inserted in the optical fiber interface, providing, by the logical operation module according to an electrical level input in the first input port, a low electrical level for the base of the second transistor by using the output port after calculation, so as to turn on the laser; and
wherein if the laser control unit detects that no optical fiber is inserted in the optical fiber interface, controlling, by the laser control unit, the laser in the optical module to remain in an off state comprises:
if the laser egress control switch detects that no optical fiber is inserted in the optical fiber interface, providing, by the logical operation module according to an electrical level input in the first input port, a high electrical level for the base of the second transistor by using the output port after calculation, so as to make the laser remain in the off state.

* * * * *